United States Patent [19]

Geluk

[11] Patent Number: 4,897,879

[45] Date of Patent: Jan. 30, 1990

[54] MULTI-WAY LOUDSPEAKER SYSTEM

[75] Inventor: Ronald J. Geluk, Nootdorp, Netherlands

[73] Assignee: B & W Loudspeakers Limited, West Sussex, United Kingdom

[21] Appl. No.: 250,978

[22] Filed: Sep. 23, 1988

Related U.S. Application Data

[63] Continuation of Ser. No. 36,230, Apr. 9, 1987, abandoned.

[30] Foreign Application Priority Data

Apr. 9, 1986 [NL] Netherlands ........................ 8600901

[51] Int. Cl.[4] ................................................ H03G 5/00

[52] U.S. Cl. ...................................................... 381/99

[58] Field of Search ........................... 381/99, 100, 98

[56] References Cited

U.S. PATENT DOCUMENTS

| | | | |
|---|---|---|---|
| 2,084,160 | 6/1937 | Minton et al. | 381/100 |
| 2,846,503 | 8/1958 | Kump | 381/100 |
| 3,931,469 | 1/1976 | Elliott et al. | 381/99 |
| 4,691,362 | 9/1987 | Eberbach | 381/99 |

FOREIGN PATENT DOCUMENTS 734346 7/1955 United Kingdom .

OTHER PUBLICATIONS

Ashley, et al., "Active and Passive Filters as Loudspeaker Crossover Networks", *J. Audio Eng. Society, vol. 19, No. 6, Jun. 1971, p. 498, rt. col.-p. 499.*

Small, "Constant-Voltage Crossover Network Design", *J. Audio Eng. Society, No. 19, No. 1, Jan. 1971, pp. 12-19.*

"A Family of Linear-Phase Crossover Networks of High Slope Derived by Time Delay", *J. Audio Eng. Society, vol. 31, No. 1/2, Jan./Feb. 1983, 2-19.*

*Primary Examiner*—Forester W. Isen

*Attorney, Agent, or Firm*—Merchant, Gould, Smith, Edell, Welter & Schmidt

[57] ABSTRACT

A multi-way loudspeaker system comprising at least two series connected loudspeakers ($Z_H$, $Z_L$) connected to a common signal input (1, 2) for reproducing different parts of the full frequency spectrum of an audio signal applied to the signal input and being provided with a passive dividing network including a first impedance ($Z_1$) connected in parallel to a first loudspeaker ($Z_H$) for reproducing a first part of the audio-frequency spectrum and a second impedance ($Z_2$) connected in parallel to a second loudspeaker ($Z_L$) for reproducing a second part of the audio-frequency spectrum. The loudspeaker system is provided with a compensating circuit consisting of a transformer (T) and an impedance ($Z_N$) connected in series with the primary winding and/or the secondary winding of the transformer for compensating the current flowing through one loudspeaker of the system and being fed thereto through the loudspeaker(s) being connected in series therewith so as to increase the slope of the attenuation characteristic of one section of the dividing network from its normal value of 6dB per octave to a value of 12dB per octave.

10 Claims, 2 Drawing Sheets

MULTI-WAY LOUDSPEAKER SYSTEM

This is a continuation, of application Ser. No. 36,230, filed Apr. 9, 1987 now abandoned.

The invention relates to a multi-way loudspeaker system comprising at least two series connected loudspeakers being connected to a common signal input for reproducing different parts and in particular a low-frequency part and a high-frequency part of the full frequency spectrum of an audio signal being supplied to the signal input and being provided with a passive dividing network including a first impedance connected in parallel to a first loudspeaker for reproducing a first part of the audio-frequency spectrum and/or a second impedance connected to a second loudspeaker for reproducing a second part of the audio-frequency spectrum.

Multi-way loudspeaker systems of this kind are widely known and various forms of dividing networks to be use din such systems have been described in the article "Constant-Voltage Crossover Network Design" by R. H. Small in "Proceedings I.R.E.E.Australia" of March 1970, pages 66–73. As indicated in this article passive dividing networks of the first order except for the advantage of having a simpler construction than dividing networks of higher orders moreover have the important advantage over such higher-order networks that by means thereof a multi-way loudspeaker system can be realized in which a signal applied to the signal input thereof is transferred ot the loudspeakers without amplitude and/or phase distortion, which according to the prevailing views cannot be achieved with passive dividing networks of higher orders.

As also mentioned in the above article, however, passive dividing networks of the first order have the disadvantage that the various sections hereof have attenuation characteristics with a slope of only 6dB per octave, whereby with such networks only a relaively poor separation between the low-frequency and high-frequency parts of the audio-frequency spectrum can be obtained.

As indicated in the article "Active and Passive Filters as Loudspeaker Crossover Networks" by J. Robert Ashley and Allan L. Kaminsky in "Journal of the Audio Engineering Society", Vol. 19, No. 6 of June 1971, pages 494–501 the slope of the attenuation characteristics of the sections of such passive dividing network of the first order can be increased to 12dB per octave by dimensioning the filter components in such manner that a small degree of underdamping is obtained, as a result of which a slight resonant signal rise will occur. This increase of the slope of the attenuation characteristics, however, is limited to a relatively narrow frequency band around the crossover frequency, outside of which the attenuation characteristics again have a slope of 6dB per octave. Furthermore a dividing network designed in this manner has the drawback thaat due to the increased response near the crossover frequency undesirable peaks in the acoustic output power of the loudspeakers will occur at the frequencies concerned, while in the transitional range between the two parts of the audio-frequency spectrum to be separated by the network signals having a phase difference of more than 90 degrees will be applied to the loudspeakers which, as is generally known, adversely affects the polar radiation pattern of the loudspeaker system.

The invention provides a multi-way loudspeaker system of the kind as described above in which, whilst avoiding the lastmentioned drawbacks the slope of the attenuation characteristic of at least one section of the passive dividing network applied therein has been increased to at least 12dB per octave in that this sytem is provided with a circuit for compensating the current flowing through one of the loudspeakers and being fed to said loudspeaker through the loudspeaker(s) being connected in series therewith.

By means of the compensating circuit applied in the loudspeaker system according to the invention it is achieved that the current which is fed through the second loudspeaker being connected in series with the first loudspeaker being included in said circuit to the junction of both said loudspeakers does not contribute to the signal voltage across the second loudspeaker and as a result thereof a steeper slope of the attenuation characteristic for this second loudspeaker is obtained.

The invention will now be further explained with reference to the drawing, in which.

Figure 1:
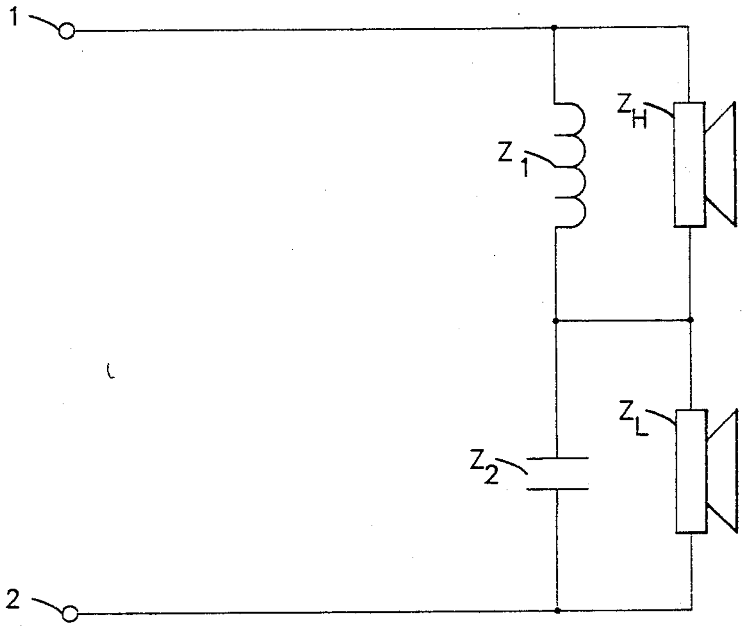
FIG. 1 is a circuit diagram of a two-way loudspeaker system being known from the prior art and including a passive dividing network of the first order.

The conventional loudspeaker system shown in FIG. 1 consists of a series connection of a loudspeaker for reproducing high frequencies having an impedance $Z_H$ and a loudspeaker for reproducing low frequencies having an impedance $Z_L$ and of a dividing network being formed by a series connection of an inductor having an impedance $Z_1$ connected in parallel to the loudspeaker for reproducing high frequencies and a capacitor having an impedance $Z_2$ being connected in parallel to the loudspeaker for reproducing low frequencies.

The series connection of both loudspeakers and the dividing network connected in parallel thereto are connected to a common signal input 1,2 and this system is dimensioned such that the impedances $Z_H$,$Z_L$,$Z_1$ and $Z_2$ have approximately equal values at the crossover frequency between both parts of the audio-frequency spectrum of the signal being fed to the signal input 1,2 to be reproduced by the loudspeakers. Furthermore, in this system, the sum of the signal voltages at the loudspeakers is equal to the signal voltage at the signal input 1,2.

As already stated in the foregoing the system shown in FIG. 1 has the drawback that the attenuation characteristics of both sections of the dividing networkk thereof have a slope of only 6dB per octave and the separation of the parts of the audio-frequency spectrum to be reproduced by the respective loudspeakers of the system effected by this network is rather poor.

Figure 2:
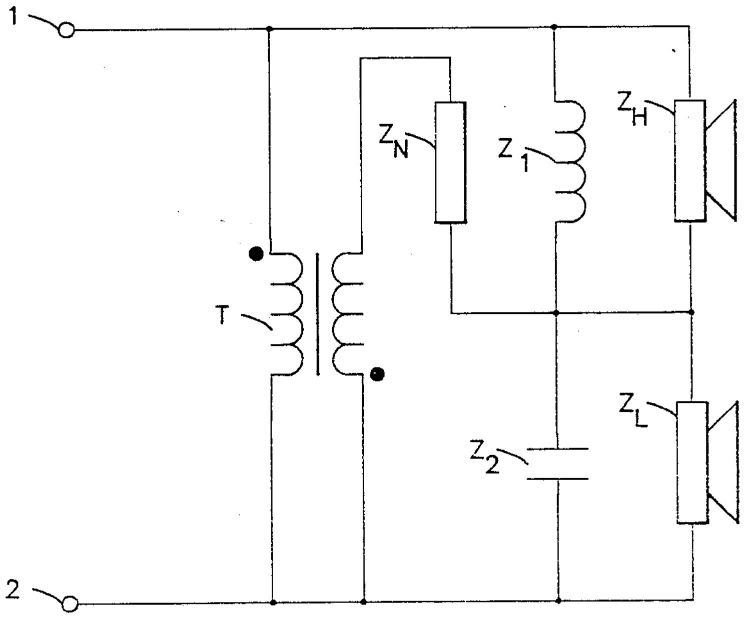
FIG. 2 is a circuit diagram of a loudspeaker system as shown in FIG. 1 and being provided with a compensating circuit according to the invention.
Figure 3:
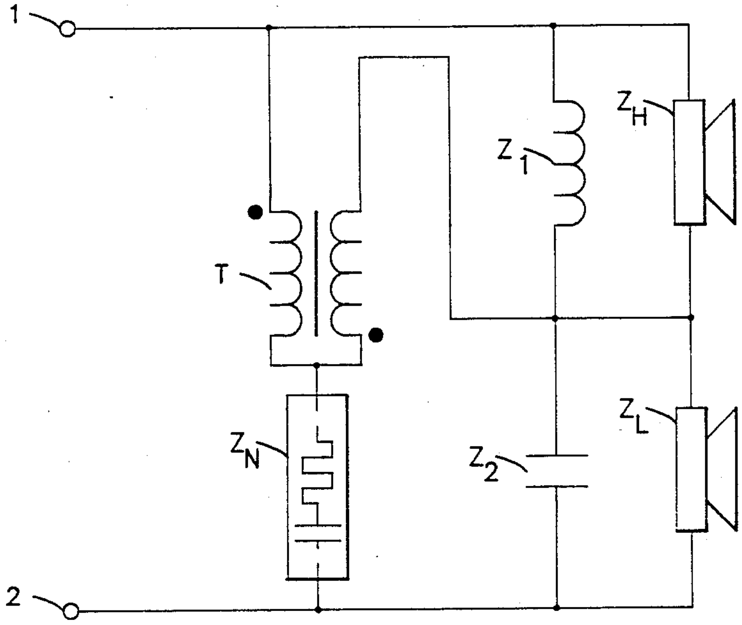
FIG. 3 is a circuit diagram of a modified embodiment of the loudspeaker system shown in FIG. 2.

In the loudspeaker systems according to the invention as shown in the FIGS. 2 and 3 this drawback, as far as the reproduction of the low frequencies is concerned, has been eliminated by the application of a compensating circuit by which the current fed through the loudspeaker for reproducing high frequencies to the parallel connection of the capacitor of the dividing network and the loudspeaker for reproducing low frequencies is compensated so that the signal voltage components with frequencies higher than the crossover frequency at said latter loudspeaker are minimized.

In the system shown in FIG. 2 the compensating circuit consists of a transformer T, the primary winding of which is directly connected to the signal input 1,2 and of an impeddance $Z_N$, which in series connection with the secondary winding of the transformer, is connected in parallel to the capacitor of the dividing network in such manner that by the compensating circuit a current is fed to the junction of both loudspeakers which is directed oppositely to the current being fed to this junction through the loudspeaker for reproducing the high frequencies. The compensation current can be made equal to the current to be compensated by a suitable selection of the ratio of transformation of the transformer and suitably dimensioning the impedance $Z_N$ and thus a complete compensation of this current can be obtained for instance with a ratio of transformation of 1:1 and with $Z_N = Z_H$.

The system shown in FIG. 3 only differs from the system of FIG. 2 in that therein the impedance $Z_N$ is connected in series with both windings of the transformer T and therefore with a ratio of transformation of 1:1 a complete compensation will be obtained for $Z_N = \frac{1}{2} Z_H$.

As with the compensating circuit only those components of the current being fed to the junction of the loudspeakers having frequencies higher than the crossover frequency need to be compensated this circuit, in order to reduce the power consumption thereof, can be provided with an impedance $Z_N$ which, as indicated by the dotted lines in FIG. 3, consists of a series connection of a resistor and a capacitor and the value of which increases from the crossover frequency towards lower frequencies.

The compensating circuit as described above effects the attenuation characteristics of the dividing network in such manner that the slope of the attenuation characteristics of the low-frequency section of said network is increased to 12dB per octave.

Although this has not been illustrated in the drawings it will be understood that in a similar way also an increase of the slope of the attenuation characteristic of the high-frequency section of the dividing network can be obtained by compensating the current being fed to the junction of the loudspeakers through the loudspeaker for reproducing the low-frequency part of the audio-frequency spectrum.

Figure 4:
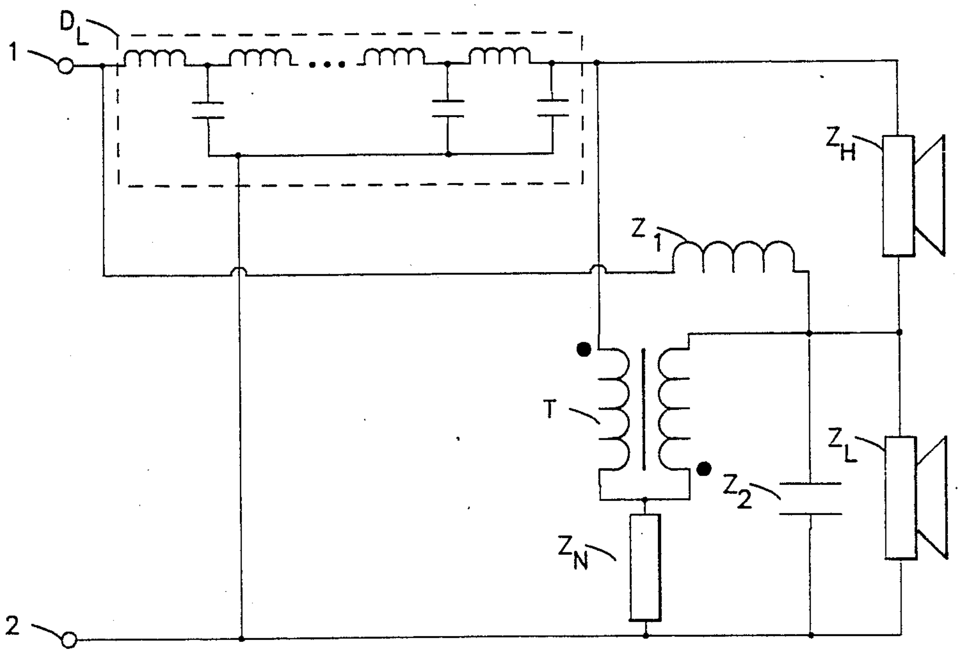
FIG. 4 is a circuit diagram of a two-way loudspeaker system according to the invention being provided with a delay line for increasing the slope of the attenuation characteristic of the high-frequency section of the dividing network.

According to a further elaboration of the invention as indicated in FIG. 4 for a system as shown in FIG. 3 it is also possible to obtain for both sections of the dividing network an attenuation characteristic having a slope of 12dB per octave by providing the dividing network in addition to the described compensating circuit with a delay line DL having a delay time equal to the delay time of the low-pass section of the dividing network.

In connection with this latter embodiment of the loudspeaker system of the invention for the sake of completeness reference can be made to the article "A Family of Linear-Phase Crossover Networks of High Slope Derived by Time Delay" by Stanley P. Lipshitz and Johan Vanderkooy in "Journal of the Audio Engineers Society", Vol. 31, No. ½, 1983, pages 2–20, from which article the use of delay lines in dividing networks in order to increase the slopes of the attenuation characteristics thereof is known per se. In this article, however, there is no mention of applying such delay line in combination with a compensating circuit according to the invention in a loudspeaker system with a passive dividing network.

What is claimed is:

1. A multi-way loudspeaker system comprising at least two series connected loudspeakers connected to a common signal input for reproducing different parts and in particular a low-frequency part and a high-frequency part of the full frequency spectrum of an audio signal applied to the signal input and provided with a passive dividing network including a first impedance connected in parallel to a first loudspeaker for reproducing a first part of the audio-frequency spectrum and a second impedance connected in parallel to a second loudspeaker for reproducing a second part of the audio-frequency spectrum in which a compensating circuit is provided to feed a compensating current to the junction of said first loudspeaker and said second loudspeaker in a direction opposite to the direction of the current being fed to said junction through the first loudspeaker.

2. A multi-way loudspeaker system comprising at least two series connected loudspeakers connected to a common signal input for reproducing different parts and in particular a low-frequency part and a high-frequency part of the full frequency spectrum of an audio signal applied to the signal input and provided with a passive dividing network including a first impedance connected in parallel to a first loudspeaker for reproducing a first part of the audio-frequency spectrum and a second impedance connected in parallel to a second loudspeaker for reproducing a second part of the audio-frequency spectrum, in which a compensating circuit is provided to feed a compensating current to the junction of said first loudspeaker and said second loudspeaker in a direction opposite to the direction of the current being fed to said junction through the first loudspeaker, and in which the dividing network comprises an input circuit comprising a delay line, the input of which is connected to the signal input of the system.

3. A multi-way loudspeaker system comprising at least two series connected loudspeakers connected to a common signal input for reproducing different parts and in particular a low-frequency part and a high-frequency part of the full frequency spectrum of an audio signal applied to the signal input and provided with a passive dividing network including a first impedance connected in parallel to a first loudspeaker for reproducing a first part of the audio-frequency spectrum and a second impedance connected in parallel to a second loudspeaker for reproducing a second part of the audio-frequency spectrum, in which a compensating circuit is provided to feed a compensating current to the junction of said first loudspeaker and said second loudspeaker in a direction opposite to the direction of the current being fed to said junction through the first loudspeaker, said compensating circuit consisting of a transformer and an impedance connected in series with the secondary winding of said transformer, the primary transformer winding being connected directly to the signal input of the system and the series connection of the secondary transformer winding and said impedance being connected to feed said compensating current to said junction.

4. A multi-way loudspeaker system comprising at least two series connected loudspeakers connectedd to a common signal input for reproducing different parts and in particular a low-frequency part and a high-frequency part of the full frequency spectrum of an audio signal applied to the signal input and provided with a passive dividing network including a first impedance connected in parallel to a first loudspeaker for reproducing a first part of the audio-frequency spectrum and a second impedance connected in parallel to a second loudspeaker for reproducing a second part of the audio-frequency spectrum, in which a compensating circuit is provided to feed a compensating current to the junction of said first loudspeaker and said second loudspeaker in a direction opposite to the direction of the current being fed to said junction through the first loudspeaker, said compensating circuit consisting of a transformer and an impedance connected in series with the secondary winding of said transformer, the primary transformer winding being connected ddirectly to the signal input of the system and the series connection of the secondary transformer winding and said impedance being connected to feed said compensating curren to said junction, and wherein the impedance connected in series with said secondary winding of the transformer is dependent on frequency in such manner that the current compensation effectedd thereby is limited to a predetermined frequency range.

5. A multi-way loudspeaker system comprising at least twoo series connected loudspeakers connected to a common signal input for reproducing different parts and in particular a low-frequency part and a high-frequency part of the full frequency spectrum of an audio signal applied to the signal input and provided with a passive dividing network including a first impedance connected in parallel to a first loudspeaker for reproducing a first part of the audio-frequency spectrum and a second impedance connected in parallel to a second loudspeaker for reproducing a second part of the audio-frequency spectrum, in which a compensating circuit is provided to feed a compensating current to the junction of said first loudspeaker and said second loudspeaker in a direction opposite to the direction of the current being fed to said junction through the first loudspeaker, said compensating circuit including a transformer and an impedance connected in series with the secondary winding of said transformer, the primary transformer winding being connected directly to the signal input of the system and the series connection of the secondary transformer winding and said impedance being connected to feed said compensating curren to said junction, and in which the dividing network comprises an input circuit including a delay line, the input of which is connected to the signal input of the system.

6. A multi-way loudspeaker system comprising at least two series connected loudspeakers connected to a common signal input for reproducing different parts and in particular a low-frequency part and a high-frequency part of the full frequency spectrum of an audio signal applied to the signal input and provided with a passive dividing network including a first impedance connected in parallel to a first loudspeaker for reproducing a first part of the audio-frequency spectrum and a second impedance connected in parallel to a second loudspeaker for reproducing a second part of the audio-frequency spectrum, in which a compensating circuit is provided to feed a compensating current to the junction of said first loudspeaker and said second loudspeaker in a direction opposite to the direction of the current being fed to said junction through the first loudspeaker, said compensating circuit including a transformer and an impedance connected in series with the secondary winding of said transformer, the primary transformer winding being connected directly to the signal input of the system and the series connection of the secondary transformer winding and said impendance being connected to feed said compensating current to said junction, and wherein the impedance connected in series with said secondary winding of the transformer is dependent on frequency in such manner that the current compensation effected thereby is limited to a predetermined frequency range, and in which the dividing network comprises an input circuit including a delay line, the input of which is connected to the signal input of the system.

7. A multi-way loudspeaker system comprising at least two series connected loudspeakers connected to a common signal input for reproducing different parts and in particular a low-frequency part and a high-frequency part of the full frequency spectrum of an audio signal applied to the signal input and provided with a passive dividing network including a first impedance connected in parallel to a first loudspeaker for reproducing a first part of the audio-frequency spectrum and a second impedance connected in parallel to a second loudspeaker for reproducing a second part of the audio-frequency spectrum, in which a compensating circuit is provided to feed a compensating current to the junction of said first loudspeaker and said second loudspeaker in a direcion opposite to the direction of the current being fed to said junction through the first loudspeaker, said compensating circuit including a transformer and an impedance connected in series with both the primary and the secondary winding of said transformer, the primary transformer winding being connected in series with said impedance to the signal input of the system and the series connection of the secondary transformer winding and said impedance being connected to feed said compensating current to said junction.

8. A multi-way loudspeaker system comprising at least two series connected loudspeakers connected to a common signal input for reproducing different parts and in particular a low-frequency part and a high-frequency part of the full frequency spectrum of an audio signal applied to the signal input and provided with a passive dividing network including a first impedance connected in parallel to a first loudspeaker for reproducing a first part of the audio-frequency spectrum and a second impedance connected in parallel to a second loudspeaker for reproducing a second part of the audio-frequency spectrum, in which a compensating circuit is provided to feed a compensating current to the junction of said first loudspeaker and said second loudspeaker in a direction opposite to the direction of the current being fed to said junction through the first loudspeaker, said compensating circuit including a transformer and an impedance connected in series with both the primary and the secondary winding of said transformer, the primary transformer winding being connected in series with said impedance to the signal input of the system and the series connection of the secondary transformer winding and said impedance being connectedd to feed said compensating current to said junction, and wherein the impedance connected in series with both the primary and the secondary windings of the transformer is dependent on frequency in such manner that the current compensation effected thereby is limited to a predeterminedd frequency range.

9. A multi-way loudspeaker system comprising at least two series connected loudspeakers connected to a common signal input for reproducing different parts and in particular a low-frequency part and a high-frequency part of the full frequency spectrum of an audio signal applied to the signal input and provided with a passive dividing network including a first impedance connected in parallel to a first loudspeaker for reproducing a first part of the audio-frequency spectrum and a second impedance connected in parallel to a second loudspeaker for reproducing a second part of the audio-frequency spectrum, in which a compensating circuit is provided to feed a compensating current to the junction of said first loudspeaker and said second loudspeaker in a direction opposite to the direction of the current being fed to said junction through the first loudspeaker, said compensating circuit including a transformer and an impedance connected in series with both the primary and the secondary winding of said transformer, the primary transformer winding being connected in series with said impedance to the signal input of the system and the series connection of the secondary transformer winding and said impedance being connectedd to feed said compensating current to said junction, and in which the dividing network comprises an input circuit including a delay line, the input of which is connected to the signal input of the system.

10. A multi-way loudspeaker system comprising at least two series connected loudspeakers connected to a common signal input for reproducing different parts and in parpticular a low-frequency part and a high-frequency part of the full frelquency spectrum of an audio signal applied to the signal input and provided with a passive dividing network including a first impedance connected in parallel to a first loudspeaker for reproducing a first part of the audio-frequency spectrum and a second impedance connected in parallel to a second loudspeaker for reproducing a second part of the audio-frequency spectrum, in which a compensatign circuit is provided to feed a compensating current to the junction of said first loudspeaker and said second loudspeaker in a direction opposite to the direction of the current being fed to said junction through the first loudspeaker, said compensating circuit including a transformer and an impedance connected in series with both the primary and the secondary winding of said transformer, the primary transformer winding being connected in series with said impedance to the signal input of the system and the series connection of the secondary transformer winding and said impedance being connected to feed said compensating current to said junction, and wherein the impedance connected in series with both the primary and the secondary windings of the transformer is dependent on frequency in such manner that the current compensation effected thereby is limited to a predetermined frequency range, and in which the dividing network comprises an input circuit includiing a delay line, the input of which is connected to the signal input of the system.

* * * * *